United States Patent
Tachimori et al.

[11] Patent Number: 5,918,151
[45] Date of Patent: Jun. 29, 1999

[54] METHOD OF MANUFACTURING A SEMICONDUCTOR SUBSTRATE AND AN APPARATUS FOR MANUFACTURING THE SAME

[75] Inventors: Masaharu Tachimori, Sagamihara; Takayuki Yano, Hikari; Isao Hamaguchi, Hikari; Tatsuo Nakajima, Hikari, all of Japan

[73] Assignee: Nippon Steel Corporation, Tokyo, Japan

[21] Appl. No.: 08/666,287

[22] PCT Filed: Dec. 28, 1994

[86] PCT No.: PCT/JP94/02297

§ 371 Date: Jun. 21, 1996

§ 102(e) Date: Jun. 21, 1996

[87] PCT Pub. No.: WO95/18462

PCT Pub. Date: Jul. 6, 1995

[30] Foreign Application Priority Data

Dec. 28, 1993 [JP] Japan .................................. 5-337894

[51] Int. Cl.⁶ .................... H01L 21/265; H01L 21/76; H01J 37/317

[52] U.S. Cl. ................. 438/766; 438/480; 250/492.21

[58] Field of Search ..................... 438/480, 528, 438/527, 529, 530, 918, 766, FOR 158, FOR 407; 148/DIG. 76, DIG. 77, DIG. 83; 257/347, 506; 250/492.2, 492.21, 398; 118/719

[56] References Cited

U.S. PATENT DOCUMENTS

| | | |
|---|---|---|
| 4,676,841 | 6/1987 | Celler . |
| 5,080,730 | 1/1992 | Wittkower . |
| 5,346,841 | 9/1994 | Yajima .......... 437/35 |
| 5,441,899 | 8/1995 | Nakai et al. .......... 438/528 |
| 5,534,446 | 7/1996 | Tachimori et al. .......... 438/527 |
| 5,661,043 | 8/1997 | Rissman et al. .......... 438/102 |

FOREIGN PATENT DOCUMENTS

| | | |
|---|---|---|
| A-49-39233 | of 1974 | Japan . |
| A-58-60556 | of 1983 | Japan . |
| A-62-188239 | of 1987 | Japan . |
| B-62-12658 | of 1987 | Japan . |
| A-63-9940 | of 1988 | Japan . |
| A-64-17444 | of 1989 | Japan . |
| A-64-37835 | of 1989 | Japan . |
| A-2-191357 | of 1990 | Japan . |
| A-2-284341 | of 1990 | Japan . |
| A-2-54562 | of 1990 | Japan . |
| A-3-240230 | of 1991 | Japan . |
| 4-737 | of 1992 | Japan . |
| A-249323 | of 1992 | Japan . |
| A-264724 | of 1992 | Japan . |
| A-5-47342 | of 1993 | Japan . |

OTHER PUBLICATIONS

Nakashima et al., Analysis of Buried Oxide Layer Formation And Mechanism Of Threading Dislocation Generation In The Substoichiometric Oxygen Dose Region, J. Mater. Res., vol. 8 1993, pp. 523–534.

(List continued on next page.)

*Primary Examiner*—John F. Niebling
*Assistant Examiner*—S. Mulpuri
*Attorney, Agent, or Firm*—Pollock, Vande Sande & Amernick

[57] ABSTRACT

A method for manufacturing an SOI semiconductor substrate and a manufacturing apparatus therefor in which a mean implantation depth and a dose of each of a series of oxygen ion implantations are continuously or stepwise changed, a depthwise distribution of an oxygen atom concentration has a single peak and uniform in a plane at a predetermined depth, a maximum oxygen atom concentration is preferably no larger than $2.25 \times 10^{22}$ atoms/cm³ and no smaller than $1.0 \times 10^{22}$ atoms/cm³, a total oxygen dose is equal to a desired thickness of a buried oxide film multiplied by $4.48 \times 10^{22}$ (in ions/cm³), and preferably a thermal process at a temperature of 1300° C. or higher is applied after the completion of the oxygen ion implantation to form the buried oxide film.

7 Claims, 9 Drawing Sheets

OTHER PUBLICATIONS

Li et al., Analysis Of Thin–Film Silicon–On–Insulator Structures Formed By Low–Energy Oxygen Ion Implantation, J. Appl. Phys., vol. 70 1991, pp. 3605–3612.

Robinson et al., Low Energy, Oxygen Dose Optimization For Thin Film Separation By Implanted Oxygen, Materials Sci. and Eng. B12 1992, pp. 41–45.

Badenes et al., Minimum oxygen dose for reliable application of SIMOX, Materials Science and Engineering B, vol. B12, No. 1, 1992, pp. 149–151.

Patent Abstracts of Japan, vol. 12, No. 215, (E–623) 1988, and JP–A–63 009940 (Fujitsu Ltd).

Chiang et al., Oxidation of silicon by ion implantation and laser irradiation, Applied Physics Letters, 1981, vol. 39, No. 9.

Patents Abstract of Japan, vol. 16, No. 340 (E–1238), 1992, & JP–A–04 102317 (Mitsubishi Electric Corp.), 1992.

Patent Abstracts of Japan, vol. 18, No. 080, (E–1505) 1994, and JP–A–05 291543 (Fujitsu Ltd), 1993.

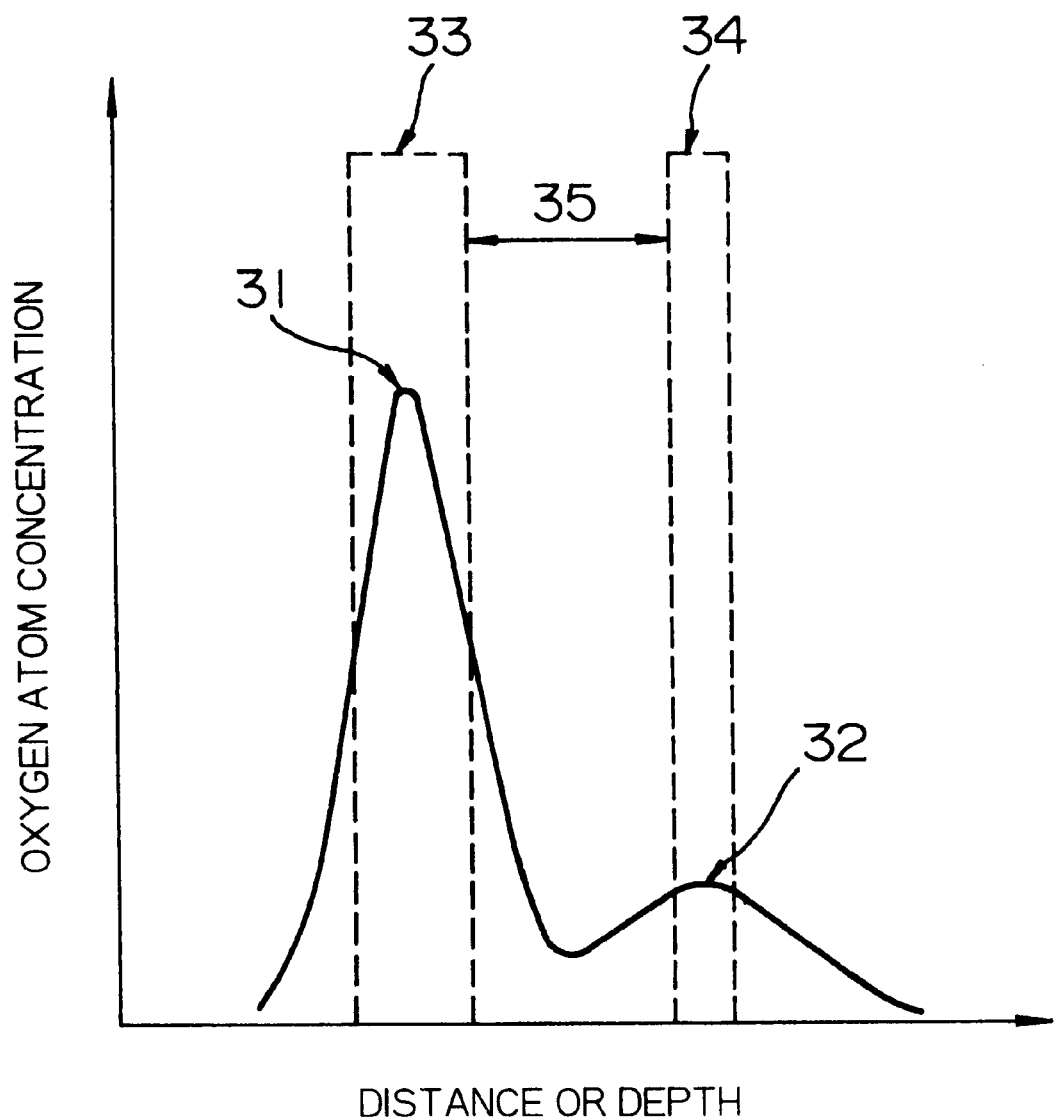

METHOD OF MANUFACTURING A SEMICONDUCTOR SUBSTRATE AND AN APPARATUS FOR MANUFACTURING THE SAME

FIELD OF THE INVENTION

The present invention relates to a manufacturing method of a semiconductor substrate and an apparatus for manufacturing the same, and more particularly to a method for manufacturing a silicon-on-insulator (hereinafter referred to as SOI) type semiconductor substrate by implanting oxygen ions into a silicon substrate, and an apparatus for manufacturing the same.

BACKGROUND OF THE INVENTION

The formation of an insulation layer by implanting ions into a semiconductor substrate is a well-known technique as disclosed in Japanese Patent Publication No. 49-39233. In the past, as a method for implanting oxygen ions into a single crystal silicon substrate to form a silicon oxide film which is an electrically insulative material (hereinafter referred to as a buried oxide layer) in the substrate and form a single crystal silicon layer having a uniform thickness over an entire surface of the substrate on the buried oxide layer, the following methods have been known.

Japanese Patent Publication No. 62-12658 discloses a method of ion-implanting oxygen into a single crystal substrate kept at a temperature of 200° C. or higher to result in a concentration which is as 1.5 times as large as an oxygen concentration ($4.5 \times 10^{22}$ ions/cm$^3$) in a uniform insulation layer to form a discrete boundary between the buried oxide layer and the single crystal silicon layer on the surface. This method, however, has a defect in that the dislocation density in the single crystal silicon layer on the surface is $10^5$ /cm$^2$ or higher.

JP-A-62-188239 and U.S. Pat. No. 4,676,841 disclose a method for forming a sharp boundary free from non-stoichiometric silicon dioxide at the boundary of the single crystal silicon layer and the buried oxide film by implanting oxygen ions into the silicon substrate at an energies of 100 to 400 KeV and a dose of $5 \times 10^{17}$ to $5 \times 10^{18}$ ions/cm$^2$ and thermally processing it in an nitrogen atmosphere at a temperature of at least 1300° C. for six hours to ten minutes. This method, however, has a defect in that the dislocation density in the single crystal silicon layer on the surface is $10^3$/cm$^2$ or higher and a continuous buried oxide film cannot be formed.

JP-A-64-17444 discloses a method for forming an oxide or nitride buried insulation layer by conducting multiple continuous implantations of oxygen or nitrogen ions into the silicon substrate at the same energy and at a dose of $1.5 \times 10^{18}$ ions/cm$^2$, and after each implantation, annealing the substrate at a temperature no lower than 800° C. and no higher than a melting point of the substrate. This method, however, has a defect in that the dislocation density in the single crystal silicon layer on the surface is no higher than $10^5$ /cm$^2$ but it is lower than $10^3$ /cm$^2$.

JP-A-2-191357 discloses a method for preventing channeling in the oxygen ion implantation by implanting silicon ions at a dose of $10^{18}$ ions/cm$^2$ to such a depth that the oxygen ion concentration exhibits $10^{21}$ ions/cm$^3$ (shallower one of two) to make it amorphous and then implanting oxygen ions, and preventing the occurrence of crystal defect in a surface silicon layer which is induced by void holes or excess oxygen by reducing the void holes and excess oxygen by implanted silicon. However, this method has a defect in that the dislocation in the single crystal silicon layer on the surface rather increases due to the silicon atoms and the excess implanted silicon atoms generated in the lattices in the course of the formation reaction of the buried oxide film.

JP-A-3-240230 discloses a method for forming a thin surface single crystal silicon layer on a buried oxide film of a predetermined film thickness while preventing the generation of crystal defects by reducing the oxygen ion dose, by applying a first thermal process to a silicon substrate to which oxygen ions have been implanted at a first implantation energy, specifically applying the thermal process in an Ar atmosphere at 1320° C. for six hours to form a first buried oxide film, and then implanting a smaller amount of oxygen ions than that of the first implantation at a second implantation energy lower than the first implantation energy and applying the same thermal processing as that of the first thermal processing to form a second buried oxide film superimposed on the first buried oxide film. However, this method cannot reduce the oxygen ion dose to attain the buried oxide film of the predetermined thickness, and the dislocation density in the single crystal silicon layer on the surface is $10^3$ /cm$^2$ or higher.

JP-A-4-249323 discloses a method for implanting first oxygen ions into a major surface of a silicon substrate at a first high energy which imparts an oxygen concentration distribution in which the oxygen concentration is maximum at a position below the major surface of the silicon substrate, then thermally processing the silicon substrate to form a buried oxide film in the silicon substrate, then implanting second oxygen ions into the major surface of the silicon substrate at a second high energy which imparts an oxygen concentration distribution in which the oxygen distribution is maximum in a vicinity of interface between the buried oxide film and the overlying surface silicon layer, and then thermally processing the silicon substrate to make the interface between the buried oxide film and the surface single crystal silicon layer planar. However, this method has a defect in that the dislocation density in the surface single crystal semiconductor silicon layer is $10^3$ /cm$^2$ or higher.

JP-A-4-264724 discloses a method for making the islocation in the surface single crystal silicon layer $10^3$ /cm$^2$ or lower by implanting oxygen ions into the silicon substrate at an acceleration energy of 150 KeV to 200 KeV and at a dose of no smaller than $0.25 \times 10^{18}$ ions/cm$^2$ and no larger than $0.50 \times 10^{18}$ ions/cm$^2$ or no smaller than $0.80 \times 10^{18}$ ions/cm$^2$ and no larger than $1.30 \times 10^{18}$ ions/cm$^2$ and then thermally processing it at a high temperature of 1300° C. or higher. However, as disclosed by S. Nakashima et al in J. Mater. Res., Vol. 8 (1993), pp. 523–534, this method includes the following defect: when the oxygen ion dose is no higher than $0.3 \times 10^{18}$ ions/cm$^2$, a continuous buried oxide film is not always formed and dislocations of $10^3$ /cm$^2$ or higher are generated in the single crystal silicon layer on the buried oxide film. These dislocations cause a current leakage of semiconductor devices formed on the SOI structure and deteriorate the characteristic of the semiconductor devices. When the oxygen ion dose is no smaller than $0.4 \times 10^{18}$ ions/cm$^2$ and no larger than $1.2 \times 10^{18}$ ions/cm$^2$, an imperfect silicon oxide film including silicon grains is formed. The buried oxide film which includes the silicon grains has a low dielectric breakdown voltage and deteriorates the characteristic of the semiconductor devices formed on the SOI structure. When the oxygen ion dose exceeds $1.2 \times 10^{18}$ ions/cm$^2$, dislocations of $10^3$~$10^9$ /cm$^2$ occur in the single crystal silicon layer on the buried oxide film. When the oxygen ion dose is no smaller than $0.3 \times 10^{18}$ ions/cm$^2$ and no larger than $0.4 \times 10^{18}$ ions/cm$^2$, the dislocation density in the single crystal silicon layer on the buried oxide film is no larger than $10^3$ /cm$^2$ and the continuous buried oxide film including no silicon grain is formed but, in this case, the thickness of the buried oxide layer is limited to approximately 70 to 90 nm. In this connection, Y. Li et al discusses in J. Appl. Phys., Vol. 70 (1991), pp. 3605–3612, a critical oxygen ion dose at which the continuous buried oxide film is formed as a function of a projected range of the oxygen ions. A. K. Robinson et al discloses in Maer. Sci. Eng., B12 (1992), pp.41–45, that the oxygen ion dose at which the buried oxide film including no silicon grain is formed and the single crystal silicon layer with few dislocations is formed is $0.33 \times 10^{18}$ ions/cm$^2$ for the implantation energy of 70 KeV.

JP-A-4-737 discloses a method for simply forming a silicon layer of sufficiently thin thickness such as 80 nm on a buried oxide film of sufficiently large thickness, such as 400 nm, in which a cap film comprising a silicon oxide film or a silicon nitride film is formed on a silicon substrate, then oxygen ions are implanted into the silicon substrate through the cap film, then it is thermally processed to form a buried oxide film, and the cap film is removed before or after the thermal process. However, this method does not always allow the formation of the continuous and homogeneous buried oxide film and the single crystal silicon layer with low dislocations.

U.S. Pat. No. 5,080,730 discloses a method for forming a narrow buried oxide film by reducing an implantation energy to compensate for the erosion of the surface of the silicon substrate by the ion beam when the oxygen or nitrogen ions are implanted into the silicon substrate so that the ions are implanted into the same position of the silicon substrate, and a method for forming a wide buried insulation film by increasing the implantation energy to compensate for the erosion of the surface of the silicon substrate by the ion beam. However, this method does not always allow the formation of the continuous and homogeneous buried insulation film of a desired thickness and the single crystal silicon layer with low dislocations.

OBJECTS OF THE INVENTION

It is an object of the present invention to provide a method for manufacturing an SOI type semiconductor substrate by implanting oxygen ions in a silicon substrate in which the number of dislocations in a single crystal silicon layer on a buried oxide film which is an insulation material is less than $10^3$ cm$^2$ and which allows the formation of the continuous buried oxide film including no silicon grain. It is also an object of the present invention to provide a manufacturing method for forming a buried oxide film having a thickness of 90 nm or larger.

It is another object of the present invention to provide an apparatus for implementing the above method.

BRIEF SUMMARY OF THE INVENTION

In order to achieve the above objects of the present invention, a method for manufacturing an SOI type semiconductor substrate of the present invention comprises the step of implanting oxygen ions into a major surface of a silicon substrate to obtain a maximum oxygen atom concentration being no larger than $4 \times 10^{22}$ atoms/cm$^3$ and no smaller than $1.0 \times 10^{22}$ atoms/cm$^3$.

An apparatus for manufacturing a semiconductor substrate of the present invention comprises a first processing unit for receiving ion implantation conditions in a series of ion implantation processes to output the implanted atom concentration distribution in the substrate for each implantation condition, a second processing unit for receiving the output of said first processing unit to output an accumulated atom concentration distribution which is the sum of the implanted atom concentration distribution in the substrate for each ion implantation condition over the series of ion implantations, a third processing unit for receiving the output of said second processing unit as a first input and one of conditions to be met by a desired atom concentration distribution as a second input to determine whether said first input matches to said second input or not and outputting a first output representing the decision and a second output representing a difference between said first input and said second input, and a fourth processing unit for receiving the first and second outputs of said third processing unit as first and second inputs. Respectively to output the series of ion implantation conditions inputted to said first processing unit as a first output when the first output of said third processing unit is affirmative, and output a second output indicating a correction amount to correct a selected one of the series of ion implantation conditions inputted to said first processing unit to decrease the second input when the first output of said third processing unit is negative.

BRIEF DESCRIPTION OF THE DRAWINGS

FIG. 6 illustrates an effect by a shape of a distribution curve of the oxygen atom concentration to the form of the buried oxide film.

DETAILED DESCRIPTION OF THE INVENTION

Referring to the accompanying drawings, a method for manufacturing a silicon substrate in accordance with the present invention is explained.

Figure 1A:
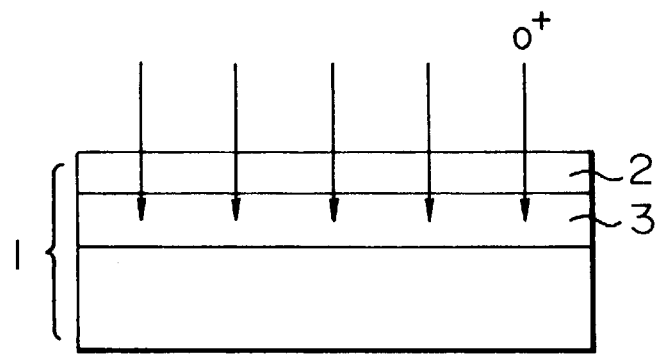
FIGS. 1A through 1C show substrate sectional views (FIGS. 1A and 1C) in an implantation process and an oxygen atom concentration distribution (FIG. 1B) of a substrate by the implantation to illustrate an implantation condition when oxygen ions are implanted into the substrate by the manufacturing method of the present invention.
Figure 1B:
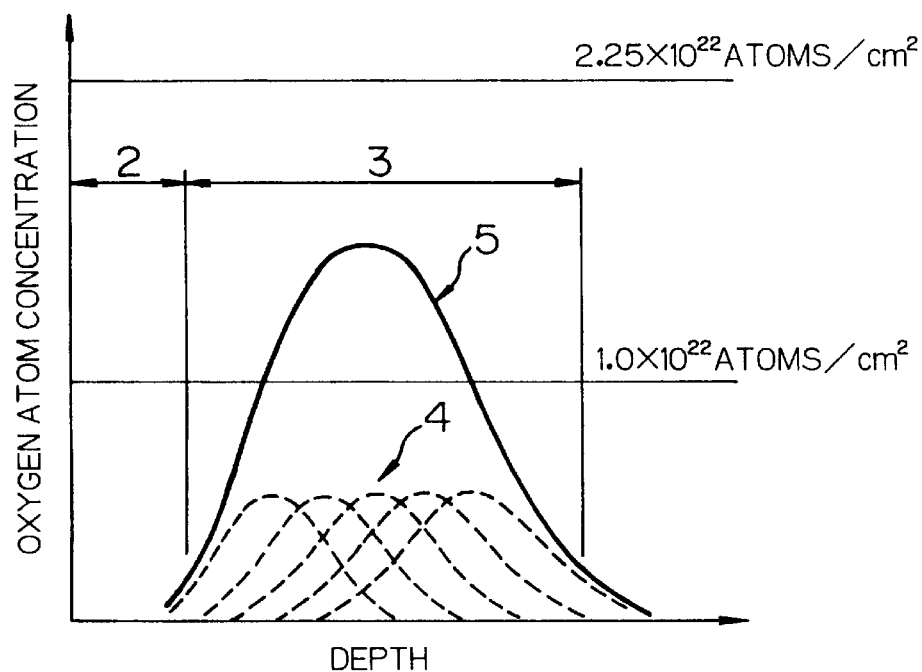
Figure 1C:
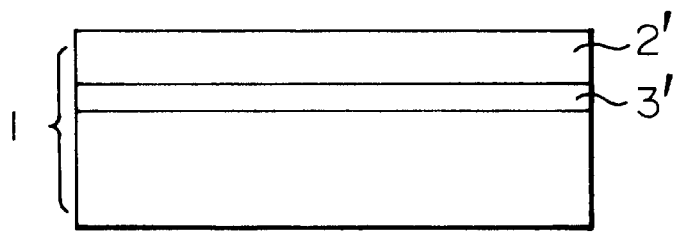

As shown in FIG. 1A, in accordance with the present invention, oxygen ions are implanted into a major surface of a silicon substrate 1 and then it is thermally processed to change a silicon layer 2 of the surface having a number of crystal defects created by the ion implantation into a single crystal silicon layer 2' of reduced number of crystal defects, as shown in FIG. 1C, and oxygen atoms implanted into an oxygen ion implantation area 3 are reacted with silicon atoms of the substrate and an implantation condition to form a continuous and homogeneous silicon oxide film, that is, a buried oxide layer 3' is determined in the following manner.

A series of oxygen ion implantation processes may be conducted continuously or intermittently. When it is conducted continuously, the oxygen implantation condition, that is, a mean implantation depth and an ion dose are changed stepwise or continuously while continuing the implantation. When the oxygen implantation process is continuously conducted and the implantation condition is changed while continuing the implantation, the implantation condition at each of predetermined time points in a process execution period is determined such that a final oxygen concentration distribution derived by a series of processes meets the following conditions:

(1) As shown in FIG. 1B, in a series of oxygen ion implantation processes, a mean implantation depth and an ion dose of the oxygen ion implantation 4 in each process are continuously or stepwise changed such that a depthwise distribution 5 of the oxygen atom concentration derived by the series of oxygen ion implantation processes has one peak and continuously decreases before and after the peak.

(2) The peak of the oxygen atom concentration distribution 5 which is also a maximum value is set to no larger than $4.0 \times 10^{22}$ atoms/cm$^3$ and no smaller than $1.0 \times 10^{22}$ atoms/cm$^3$, and preferably no larger than $2.25 \times 10^{22}$ atoms/cm$^3$ and no smaller than $1.0 \times 10^{22}$ atoms/cm$^3$ and the total dose (in ions/cm$^2$) in the series of oxygen ion implantations is set to a value of a desired thickness (in cm) of the buried oxide film multiplied by $4.48 \times 10^{22}$ (in ions/cm$^3$).

Figure 2A:
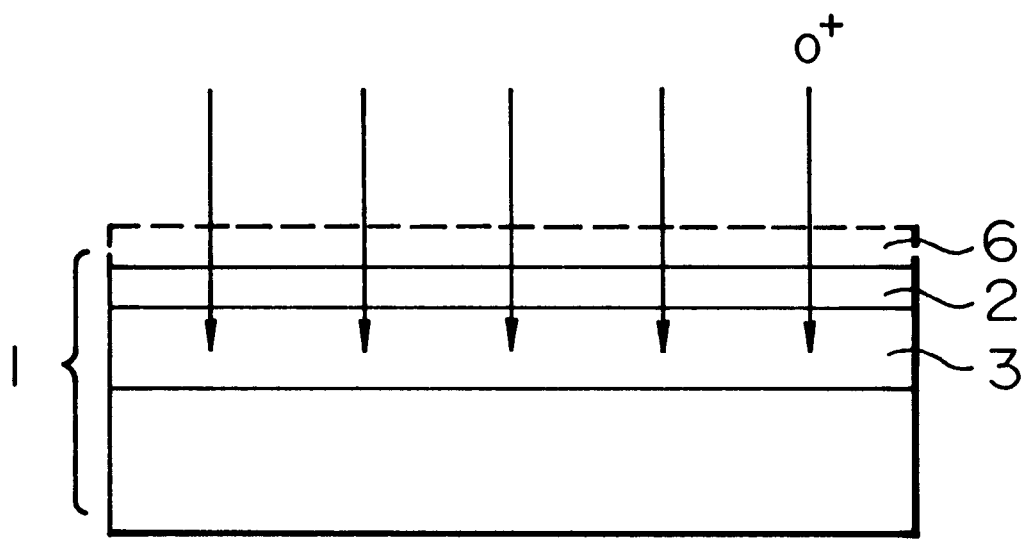
FIGS. 2A and 2B illustrate various methods for changing a depthwise position of the oxygen ion implantation.
Figure 2B:
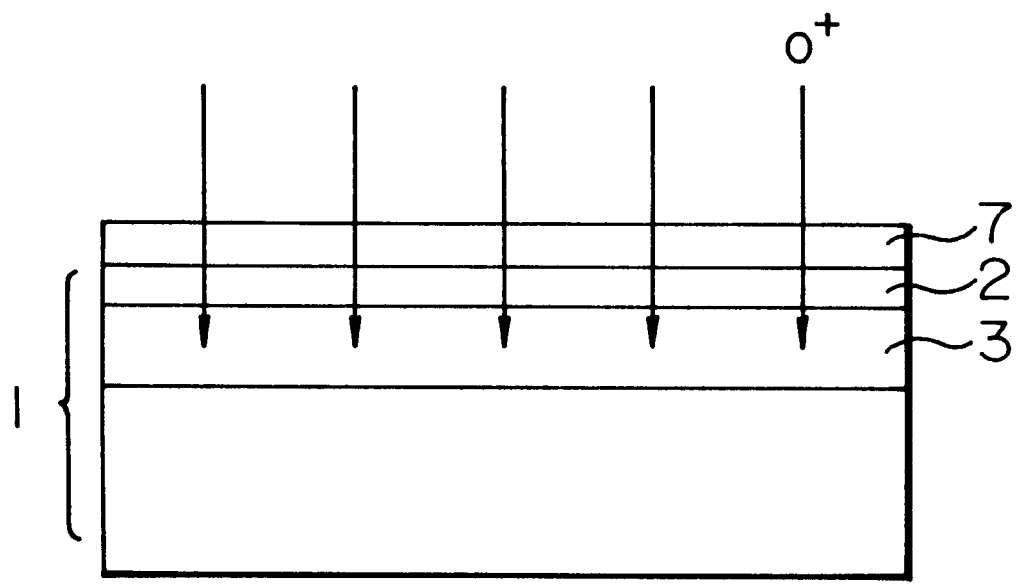

(3) The change of the implantation depth of the oxygen ions is conducted by changing an implantation energy, removing a surface 6 of the silicon substrate 1 as shown in FIG. 2A and depositing a film 7 on the surface of the silicon substrate 1 as shown in FIG. 2B.

(4) Thermal processing is conducted at a high temperature of 1300° C. or higher after the completion of the series of oxygen ion implantations to form a stoichiometric buried oxide film 3' and a single crystal silicon layer 2' having fewer crystal defects.

Figure 4A:
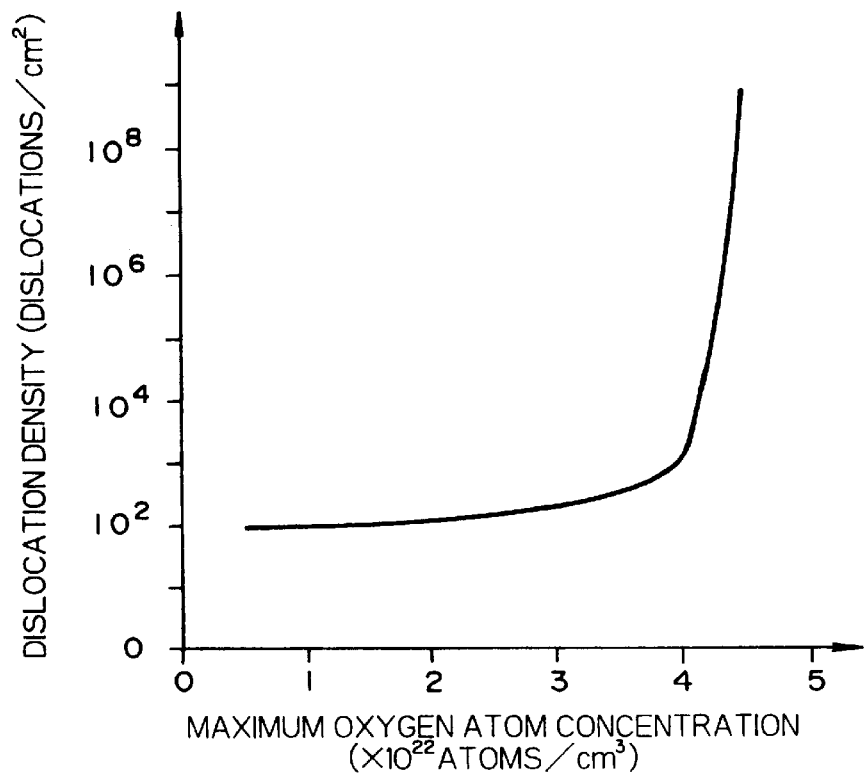
FIG. 4A is a characteristic curve showing a relation between a maximum oxygen atom concentration in the substrate and a dislocation density in the single crystal silicon layer on the buried oxide film.
Figure 4B:
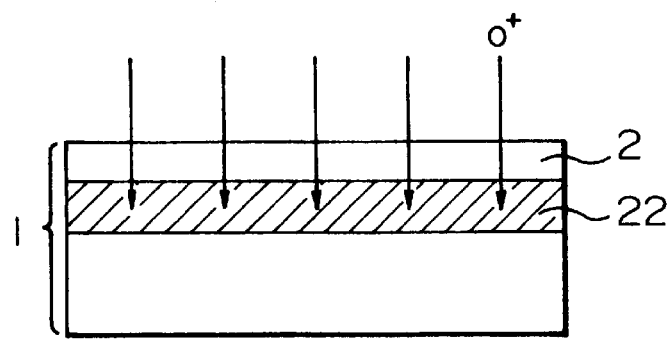
FIGS. 4B and 4C show sectional views for illustrating a change in the sectional state of the substrate by the change of the maximum oxygen atom concentration.
Figure 4C:
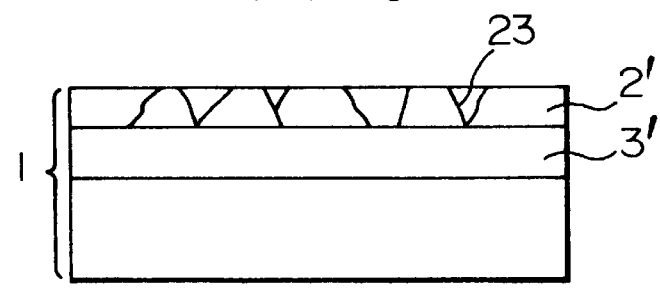

A relation between the dislocations in the semiconductor silicon layer on the buried oxide film and the oxygen dose in the method for forming the single crystal silicon layer having a uniform thickness over the entire surface of the substrate on the buried oxide film which is the insulation material by implanting the oxygen ions into the silicon substrate is reported by S. Nakashima et al in J. Mater. Res., Vol.8, (1993), pp.523–534. According to the investigation by the inventors of the present invention on the generation of dislocations in the single crystal silicon layer on the buried oxide film, it has been proved that the number of dislocations in the single crystal silicon layer does not necessarily depend on the dose of the oxygen ions but it essentially depends on the maximum concentration of the oxygen atoms implanted in the silicon substrate. When the oxygen ion implantation into the silicon substrate is continued, the oxygen atom concentration in the silicon substrate increases and when the oxygen atom concentration exceeds $4.0 \times 10^{22}$ atoms/cm$^3$, the formation of a non-stoichiometric silicon oxide film 22 in which silicon is microscopically mixed with an SiO$_2$ phase as shown in FIG. 4B is observed. When the oxygen atom concentration reaches $4.48 \times 10^{22}$ atoms/cm$^3$, a stoichiometric silicon oxide film is formed. It has been proved that when the oxygen ions are further implanted after the formation of the non-stoichiometric silicon oxide film 22 in the silicon substrate, the concentration of the dislocations 23 in the single crystal silicon 2' on the buried oxide film 3' after the thermal process rapidly increases as shown in FIG. 4C. The increase of the dislocations is also proved by the oxygen ion implantation after the formation of the stoichiometric silicon oxide film. FIG. 4A shows a relation between a maximum oxygen atom concentration implanted in the silicon substrate and a dislocation density. When the oxygen atom concentration is $4.0 \times 10^{22}$ atoms/cm$^3$ or lower, that is, when the formation of the non-stoichiometric silicon oxide film is not observed during the oxygen ion implantation, the dislocation density is lower than $10^3$ /cm$^2$, and when the oxygen atom concentration exceeds $4.0 \times 10^{22}$ atoms/cm$^3$ is observed, that is, when the formation of the non-stoichiometric silicon oxide film or the formation of the stoichiometric silicon oxide film is observed, the dislocation density is $10^3$ /cm$^2$ or higher.

When the oxygen ion implantation and the thermal process are repeated in a plurality of cycles, the oxygen atom concentration in the silicon substrate after the implantation of the oxygen ions in one run may not exceed $4.0 \times 10^{22}$ atoms/cm$^3$ but the oxygen atom concentration after the next thermal process may exceed $4.0 \times 10^{22}$ atoms/cm$^3$ by the movement of the oxygen atoms during the next thermal process. In such a case, the dislocation density in the semiconductor silicon film on the buried oxide film exceeds $10^3$ dislocations/cm$^2$ if the oxygen ions are implanted in the next run. Accordingly, the formation of the buried oxide film and the overlying single crystal silicon layer in the course of the series of oxygen ion implantation should be avoided. In the present invention, in order to keep the dislocation density in the single crystal silicon layer on the buried oxide film to lower than $10^3$ /cm$^2$, the maximum oxygen atom concentration in the silicon substrate is kept no larger than $4.0 \times 10^{22}$ atoms/cm$^3$ during the implantation of the oxygen ions into the silicon substrate and the thermal process at 1300° C. or higher to form the buried oxide film and the overlying single crystal silicon is conducted after the completion of the series of oxygen ion implantations.

Figure 5A:
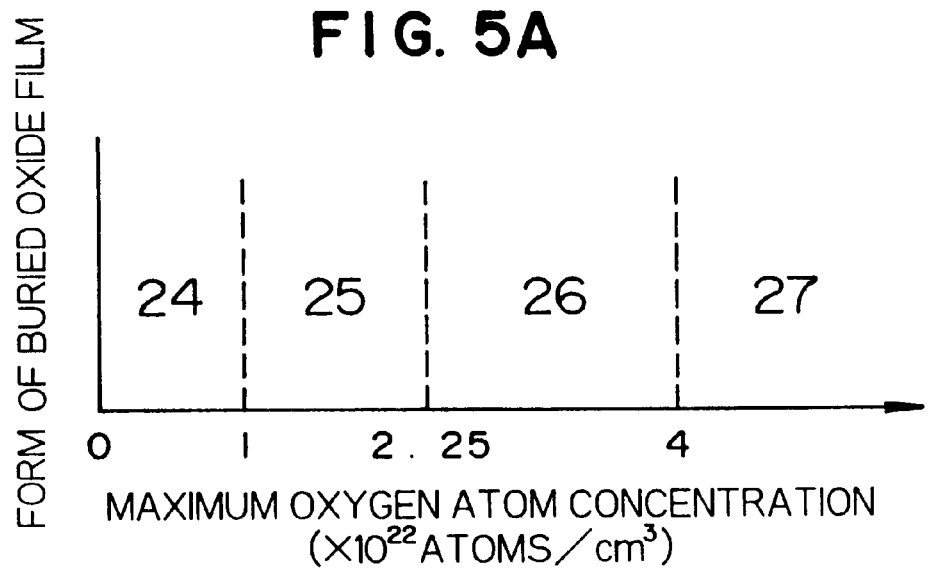
FIG. 5A shows a relation between the maximum oxygen atom concentration and a form of the buried oxide film.
Figure 5B:
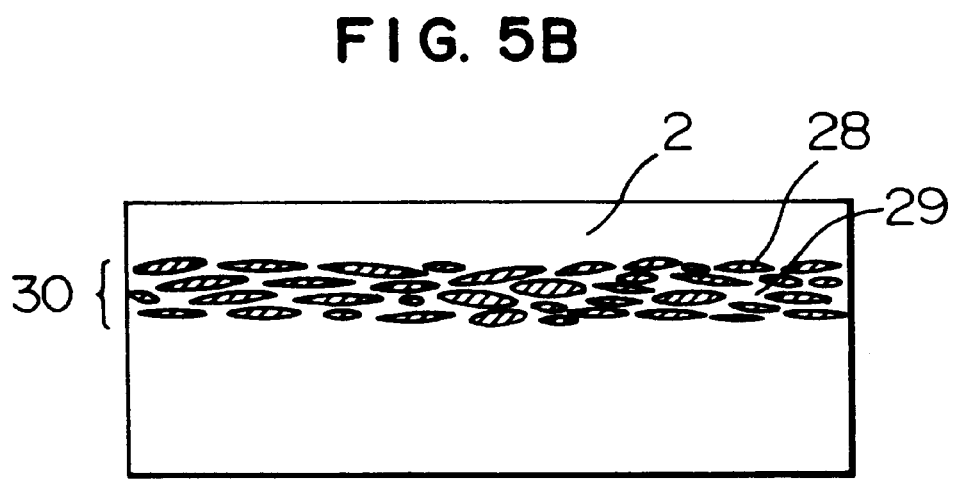
FIGS. 5B and 5C show sectional views of the substrate after the oxygen ion implantation and after the thermal process when the maximum oxygen atom is larger than $2.25 \times 10^{22}$ atoms/cm$^3$ and not larger than $4 \times 10^{22}$ atoms/cm$^3$.
Figure 5C:
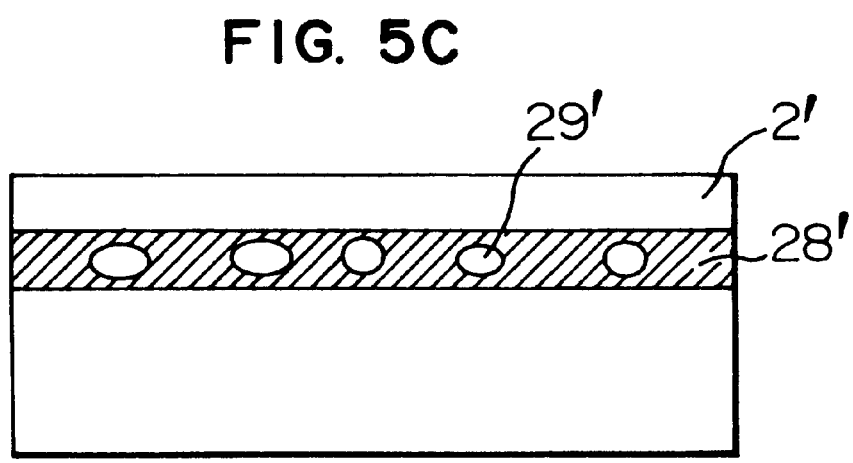

As a result of the investigation of the relation between the oxygen atom concentration after the ion implantation and the form of the buried oxide film formed by the reaction of the implanted oxygen atoms and the silicon atoms, it has been proved that the form of the buried oxide film depends on the maximum oxygen atom concentration. In FIG. 5A, in a range 27 where the maximum oxygen atom concentration exceeds $4.0 \times 10^{22}$ atoms/cm$^3$, a homogeneous and continuous buried oxide film or a continuous buried oxide film including a small amount of silicon grains in the vicinity of the interfaces to the upper or lower single crystal silicon substrates is formed. In a range 26 where the oxygen atom concentration is larger than $2.25 \times 10^{22}$ atoms/cm$^3$ and no larger than $4.0 \times 10^{22}$ atoms/cm$^3$, a buried oxide film including silicon grains is formed. In a range 25 where the maximum oxygen atom concentration is no larger than $2.25 \times 10^{22}$ atoms/cm$^3$ and no smaller than $1.0 \times 10^{22}$ atoms/cm$^3$, a homogeneous and continuous buried oxide film is formed. In a range 24 where the maximum oxygen atom concentration is smaller than $1.0 \times 10^{22}$ atoms/cm$^3$, a discontinuous buried oxide film is formed. Where the maximum value of the oxygen atom concentration exceeds $2.25 \times 10^{22}$ atoms/cm$^3$, an area where the oxygen atom concentration is larger than $2.25 \times 10^{22}$ atoms/cm$^3$ and no larger than $4.0 \times 10^{22}$ atoms/cm$^3$ comprises a microscopic mixture of an area 28 which is clearly rich in SiO$_2$ and an area 29 which is rich in Si, as seen by Auger electron spectroscopy and as shown in FIG. 5B. When such a mixture layer 30 is thermally processed at a temperature of 1300° C. or higher, the oxygen atoms present in the area 29 which is rich in Si are taken into the area 28 which is rich in SiO$_2$ as shown in FIG. 5C so that a buried oxide film 28' is grown from the area 28 while the area 29 is changed to silicon grains 29' having the oxygen atom concentration in the order of solid solubility and it is left while it is surrounded by the buried oxide film 28'. When the size of the silicon grains is sufficiently small, the silicon grains are dissolved and diffused into the buried oxide film and eliminated by applying the high temperature thermal process for a sufficiently long time. But the silicon grains 29' often remain. When the maximum value of the oxygen atom concentration is no larger than $2.25 \times 10^{22}$ atoms/cm$^3$ and no smaller than $1.0 \times 10^{22}$ atoms/cm$^3$, the area which is rich in SiO$_2$ and the area which is rich in Si cannot be clearly distinguished in the area in which the oxygen ions have been implanted even by the Auge electro spectroscopy, and when this layer is thermally processed at a temperature of 1300° C. or higher, a buried oxide film including no silicon grain is formed. When the maximum oxygen atom concentration is smaller than $1.0 \times 10^{22}$ atoms/cm$^3$, oxygen atoms must be collected from an adjacent area which is several times as large as the size of SiO$_2$ segregates, in the process of forming the stoichiometric buried oxide film by the thermal process at a temperature of 1300° C. or higher. Since the size of SiO$_2$ segregates which are stable at the temperature of 1300° C. or higher is several tens nm or larger, the stable size is not attained by collecting the oxygen atoms only from the depthwise adjacent area and hence the oxygen atoms may have to be collected from the laterally adjacent area. In such a case, the laterally adjacent area from where the oxygen atoms have been taken remains as the silicon layer so that SiO$_2$ segregaties are not grown to a continuous buried oxide film. Accordingly, in accordance with the present invention, in order to attain the continuous buried oxide film including no silicon grain, the maximum value of the implanted oxygen atom density is set to no larger than $2.25 \times 10^{22}$ atoms/cm$^3$ and no smaller than $1.0 \times 10^{22}$ atoms/cm$^3$.

When the maximum value of the oxygen atom concentration is no larger than $2.25 \times 10^{22}$ atoms/cm$^3$ and no smaller than $1.0 \times 10^{22}$ atoms/cm$^3$ and where there are a plurality of peaks in the depthwise distribution and the lateral distribution of the oxygen atom concentration, the buried oxide film including silicon grains or the discontinuous buried oxide film may be formed by applying the thermal process. This is explained with reference to FIG. 6. In FIG. 6, a solid line shows the oxygen atom concentration distribution in the silicon substrate immediately after the oxygen ion implantation, and a broken line shows the oxygen atom concentration distribution in the silicon substrate after the application of the thermal process at the temperature of 1300° C. or higher. The oxygen atoms which are present in the silicon substrate beyond the solid solubility are readily segregated as the silicon oxide by the thermal process. They are segregated preferentially from points having a higher oxygen atom concentration than that of the surrounding area, that is, from the points 31 and 32 where the oxygen atom concentration exhibits a peak, and they are grown. As the segregation progresses and the oxygen atom concentration in the silicon substrate around the segregates is decreased to the order of the solid solubility, small segregates which are smaller than a critical size determined by the thermal process temperature are dissolved and the oxygen atoms are taken into large segregates which are larger than the critical size. Where a plurality of segregates larger than the critical size remain, the continuous buried oxide film may not be formed because the area 35 of the silicon layer in which the oxygen atom concentration has been reduced to the order of the solid solubility remains between the segregation area 33 and the segregation area 34. Accordingly, in order to form the homogeneous and continuous buried oxide film at the uniform depth, it is preferable that the depthwise distribution of the implanted oxygen atom concentration has a single peak and continuously decreases before and after the peak and the lateral distribution, that is, the distribution in a plane of a constant depth is uniform.

A method for increasing the film thickness of the continuous buried oxide film is now explained. Since the film thickness (in cm) of the buried oxide film is substantially equal to a quotient of the oxygen ion dose (in ions/cm$^2$) divided by $4.48 \times 10^{22}$ (in ions/cm$^3$), the oxygen ion dose may be increased in order to increase the thickness of the buried oxide film. However, when the dose is increased while the implantation energy of the oxygen ions is fixed as it is in the prior art, the maximum concentration of the oxygen atoms will exceed $2.25 \times 10^{22}$ atoms/cm$^3$ at a certain dose or higher because the maximum value of the implanted ion concentration is approximately $0.4\phi/\sigma$ (where $\phi$ is the ion dose and $\sigma$ is a standard deviation of the implantation depth) as shown in the formula (4.2), on page 22 of "PROJECTED RANGE STATISTICS" by James F. Gibbons, William S. Johnson and Steven W. Mylroie (published by Dowden, Hutchington & Ross. Inc.). For example, when the oxygen ions are implanted into the silicon substrate held at 550° C. at the energy of 200 KeV, the oxygen ion dose at which the maximum value of the implanted oxygen atom concentration reaches $2.25 \times 10^{22}$ atoms/cm$^3$ is approximately $5 \times 10^{17}$ ions/cm$^2$ and the thickness of the buried oxide film formed by the thermal process is approximately 112 nm. When the maximum concentration of the oxygen atoms exceeds $2.25 \times 10^{22}$ atoms/cm$^3$, the buried oxide film will come to include the silicon grains as described above and the oxygen dose cannot be simply increased. Referring to FIG. 1, the method of the present invention in which the oxygen ion dose is increased while the maximum value of the oxygen atom concentration is kept to no larger than $2.25 \times 10^{22}$ atoms/cm$^3$ and no smaller than $1.0 \times 10^{22}$ atoms/cm$^3$ is explained. A broken line 4 in FIG. 1 shows the depthwise distribution of the oxygen atom concentration corresponding to the respective implantations of different mean implantation depths, and a solid line 5 shows the depthwise distribution of the oxygen atom concentration with the respective implantations being accumulated. In this manner, the series of oxygen ion implantations are conducted while the mean implantation depth is stepwise or continuously changed, and implantation dose for the respective mean implantation depths are controlled such that the maximum value of the accumulated oxygen atom concentration falls within the range described above and the total oxygen ion dose reaches the dose required to attain the buried oxide film of a predetermined film thickness. By conducting the implantation while changing the mean implantation depth, the implantation may be made depthwise widely and the dose necessary to attain the buried oxide film of the predetermined film thickness can be secured even with the low maximum value of the oxygen atom concentration. In implementing it, as described above, it is preferable that the depthwise distribution of the accumulated oxygen atom concentration has a single peak and the lateral distribution is uniform.

As a method for changing the depthwise position to implant the oxygen ions, a method of changing the implantation energy of the oxygen ions, a method of implanting while removing the silicon layer 6 on the surface of the silicon substrate as shown in FIG. 2A, a method of implanting while depositing the film 7 on the surface of the silicon substrate as shown in FIG. 2B, or a combination of those methods, may be used. As a specific method for removing the silicon layer 6 on the surface of the silicon substrate, polishing or grinding using grinding grains or kalium hydroxide aqueous solution, plasma etching using chlorine gas, sulfate hexafluoride gas or carbon hexafluoride gas or wet etching using aqueous solution of mixture of ammonium and hydrogen peroxide, aqueous solution of mixture of nitric acid and fluodic acid or aqueous solution of kalium hydroxide is appropriate. The constituent elements of the film 7 deposited on the surface of the silicon substrate are preferable those elements which do not adversely affect to an operation characteristic of a semiconductor electronic device built in the silicon substrate because the constituent elements of the film 7 are knocked-on into the silicon substrate in the course of the implantation of the oxygen ions into the silicon substrate through the film 7. A metal element is not preferable because it forms a deep level which adversely affects to the operation of the semiconductor electronic device, in the silicon substrate. Carbon and nitrogen are not preferable because they are apt to create crystal defects in the silicon substrate. Preferable constituent elements of the film 7 are silicon and oxygen and the film 7 is preferably the silicon film, the silicon oxide film or the combination film thereof.

Figure 3A:
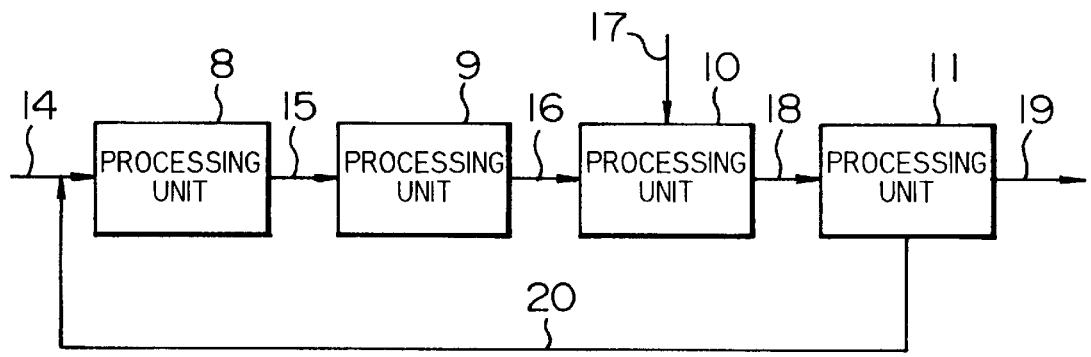
FIGS. 3A and 3B show block diagrams of a configuration of a manufacturing apparatus in accordance with one embodiment of the present invention.
Figure 3B:
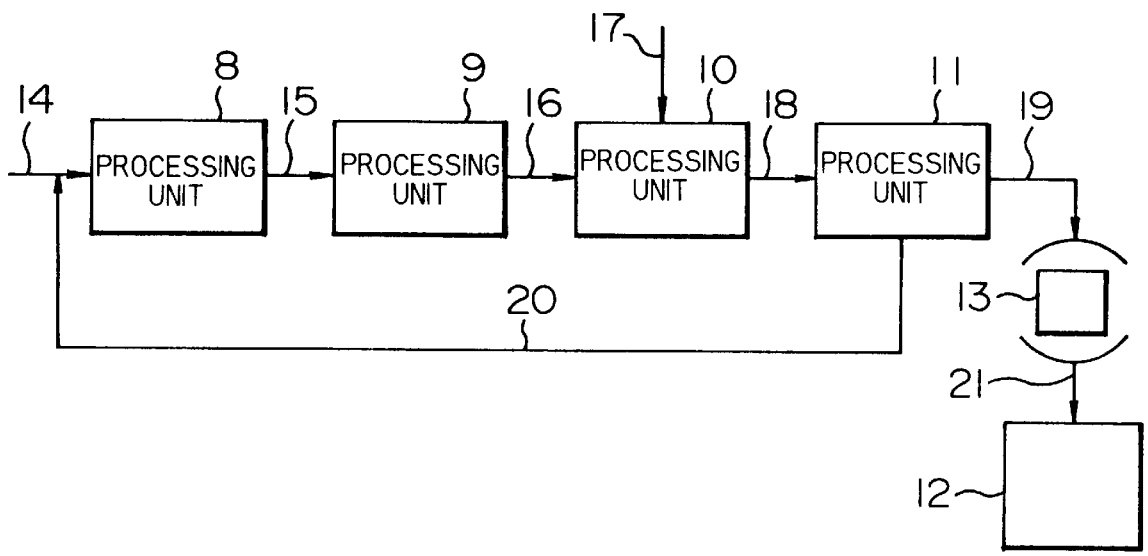

Referring to FIG. 3A, an apparatus for determining the mean implantation depth and the dose in each process of the series of oxygen ion implantation processes is explained. A program is built in a processing unit 8 such that when the implantation energy of the oxygen ions, the dose and the removal amount of the surface silicon layer are inputted, the oxygen atom concentration distribution 15 in the silicon substrate when the oxygen ions are implanted into the silicon substrate under the above condition is outputted. A program is also built in the processing unit 8 such that when the name of material deposited on the silicon surface, the film thickness, the implantation energy of the oxygen ions and the dose are inputted, the oxygen atom concentration distribution 15 in the silicon substrate when the oxygen ions are implanted into the silicon substrate through the film under the above condition is outputted. In the programs built in the processing unit 8, the effect of the erosion of the silicon surface or the film deposited on the silicon surface by the ion beam during the implantation of the oxygen ions, the channeling caused by the crystal orientation of the silicon substrate and the incident direction of the ion beam, and the effect of the silicon substrate temperature during the ion implantation are taken into consideration. As a method in the processing unit 8 for outputting the oxygen atom concentration distribution 15 in the silicon substrate from the input of the implantation condition 14 in each process of the series of oxygen ion implantation processes such as the oxygen implantation energy and the dose, a method for taking out the prestored data determined by experiment or calculation and outputting it or a method for calculating on site by a predetermined formula and output it may be used. The calculation formula to be programmed in the processing unit 8 may be the computer simulation code TRIM disclosed by J. F. Ziegler, J. P. Biersack and U. Littmark in "The Stopping and Ranges of Ions in Solids", Vol.1, by J. F. Ziegler (published by Pergamon, New York, 1985), or the computer program code IRIS disclosed by U.Bussmann and P. L. F. Hemment in Nucl. Instrum. methods B. 47 (1990), p.22. It may also be determined by experiment. A program is built in a processing unit 9 such that when the respective oxygen atom concentration distributions 15 outputted from the processing unit 8 are entered for the series of oxygen ion implantation conditions, the oxygen atom concentration distribution 16 which results from the accumulation thereof is outputted. A program is built in a processing unit 10 such that when the oxygen atom concentration distribution 16 accumulated for the series of oxygen ion implantations outputted from the processing unit 9 and a desired oxygen atom concentration distribution 17 are inputted, the matching thereof is determined and the result of matching and a difference 18 between both distributions are outputted. A program is built in a processing unit 11 such that when the result of determination outputted from the processing unit 10 and the difference 18 between the accumulated oxygen atom concentration distribution and the desired oxygen atom concentration distribution are inputted and if matching is determined, a series of oxygen ion implantation conditions 19 at that time, that is, the implantation energy, the dose, the name of material of the film deposited on the silicon substrate and the film thickness thereof or the removal amount of the silicon surface are outputted. If the determination indicates mismatching, a series of oxygen ion implantation conditions 20 which are modified to reduce the difference 17 between the accumulated oxygen atom concentration distribution 16 and the desired oxygen atom concentration distribution 17 are outputted. The number of times of oxygen implantation processes to attain the desired oxygen atom concentration distribution and the oxygen implantation condition in each process initially applied to the processing unit are determined by experiment based on the difference from the desired oxygen atom concentration distribution 17. Which one of the series of oxygen implantation conditions is to be modified is determined by experiment based on the comparison of the state of the accumulated oxygen atom concentration distribution and the state of the desired oxygen atom concentration distribution 17. The series of modified oxygen ion implantation conditions 20 outputted from the processing unit 11 are fed back to the input of the processing unit 8. When the processing units 8~11 are connected, the series of oxygen ion implantation conditions 14 are initially set to the processing unit 8 and the desired oxygen atom concentration distribution 17 is inputted to the processing unit 10, the processing unit 11 determines and outputs the series of optimum oxygen ion implantation conditions 19.

In the above description, one of the inputs of the processing unit 10 is the desired oxygen atom concentration distribution 17. Alternatively, the condition to be met by the oxygen atom concentration distribution as defined by the present invention may be used as the input.

The above conditions may be as follows:

(a) The maximum oxygen atom concentration is no larger than $4 \times 10^{22}$ atoms/cm$^3$ and no smaller than $1.0 \times 10^{22}$ atoms/cm$^3$.

(b) The maximum oxygen atom concentration is no larger than $2.25 \times 10^{22}$ atoms/cm$^3$ and no smaller than $1.0 \times 10^{22}$ atoms/cm$^3$.

(c) The depthwise distribution of the oxygen atom concentration in the silicon substrate has a single peak and continuously decreases before and after the peak.

(d) The distribution of the oxygen atom concentration in the plane of the predetermined depth in the silicon substrate is uniform.

(e) The total oxygen ion dose is equal to a value of the thickness (in cm) of the desired buried oxide film multiplied by $4.48 \times 10^{22}$ (in ions/cm$^3$).

In this case, a program is built in the processing unit 10 such that when the accumulated oxygen atom concentration distribution 16 for the series of oxygen ions implantations outputted from the processing unit 9 and the condition 17 to be met by the oxygen atom concentration distribution as defined by the present invention are inputted, whether the accumulated oxygen atom concentration distribution 16 meets the condition 17 to be met by the oxygen atom concentration distribution as defined by the present invention or not is determined, and the result of determination and the difference 18 between the value corresponding to the above condition for the accumulated oxygen atom concentration distribution 16 and the value of the above condition are outputted. Accordingly, a program is built in the processing unit 11 such that when the result of the determination outputted from the processing unit 10 and the difference 18 between the accumulated oxygen atom concentration distribution and the condition to be met by the oxygen atom concentration distribution as defined by the present invention are inputted, the implantation condition 19 in the series of oxygen ion implantations are outputted when the determination indicate the matching, and a series of oxygen ion implantation conditions 20 modified to reduce the difference between the accumulated oxygen atom concentration distribution 16 and the condition 17 to be met by the oxygen atom concentration distribution as defined by the present invention are outputted when the determination indicates mismatching. In the above description, the processing units 8~11 are shown as separate units although they may be combined appropriately or further divided.

When the implantation depth is changed by the implantation energy, the efficient operation of the oxygen ion implantation apparatus is attained by inputting the output 19 of the processing unit of FIG. 3A to the control unit 12 of the oxygen ion implantation apparatus. When required, a converter 13 may be inserted between the output 19 of the processing unit and the input 21 of the oxygen ion implantation apparatus to convert the implantation energy to an acceleration voltage for the ion beam and the ion dose to an ion beam current and an implantation time.

Experimental examples when the semiconductor substrates were manufactured in accordance with the present invention are now explained.

Experimental Example 1

Figure 7:
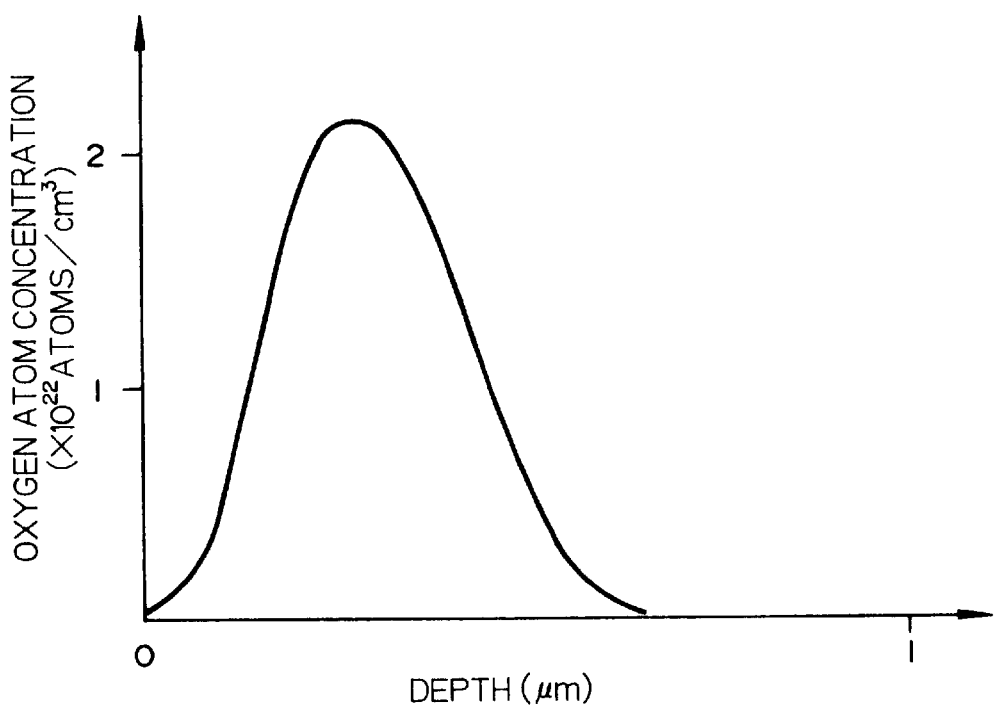
FIG. 7 shows a depthwise distribution of the oxygen atom concentration of the silicon substrate manufactured by the present invention.

Oxygen ions of total dose of $6.72 \times 10^{17}$ ions/cm$^2$ were implanted into the silicon substrate while changing the energy stepwise to form the buried oxide film having the thickness of approximately 150 nm in the silicon substrate. First, the depthwise distribution of the accumulated oxygen atom concentration derived after the series of oxygen ion implantation was set to follow the Gaussian distribution, that is, $C(z) = C_0/(2\pi)^{0.5} \sigma \times \exp(-(z-z_0)^2/2\sigma^2)$, where $C(z)$ is the oxygen atom concentration at the depth z, Co is the total dose per unit area, $\sigma$ is a standard deviation of the distribution and zo is the depth at which the oxygen atom concentration is maximum. In this example, $Co = 6.72 \times 10^{17}$ ions/cm$^2$, $\sigma = 124$ nm and $zo = 300$ nm. Since the maximum oxygen atom concentration is $Co/(2\pi)^{0.5}\sigma$, it is $2.16 \times 10^{22}$ atoms/cm$^3$. Then, the implantation energy of the oxygen ions was set to four steps of 110, 140, 170 and 200 KeV and the oxygen dose at each implantation energy was set to $1.40 \times 10^{17}$, $1.60 \times 10^{17}$, $1.78 \times 10^{17}$ and $1.94 \times 10^{17}$ ions/cm$^2$ and the series of oxygen ion implantations were conducted to the silicon substrate kept at the temperature of 600° C. In this case, in order to make the lateral distribution of the oxygen atom concentration implanted in the silicon substrate uniform, the oxygen ion beam was uniformly scanned over the entire surface of the silicon substrate. The depthwise distribution of the oxygen atom concentration in the silicon substrate after the oxygen implantation was measured by the secondary ion mass spectroscopy. The result is shown in FIG. 7. The distribution which substantially matched to the expected Gaussian distribution was attained and the maximum oxygen atom concentration was $2.16 \times 10^{22}$ atoms/cm$^3$. The silicon substrate was placed in an electric furnace and it was thermally processed in an argon gas atmosphere including 0.5% of oxygen at a temperature of 1330° C. for six hours. After the thermal process, the silicon substrate was dipped in the hydrofluoric acid to remove the silicon oxide film having the thickness of approximately 82 nm grown during the thermal process, and the cross-sectional structure of the silicon substrate was observed by a transmission electron microscope. As a result, a single crystal silicon layer having the thickness of approximately 213 nm at the top surface and a buried oxide film having the thickness of approximately 150 nm thereunder, and a silicon substrate thereunder were observed. The buried oxide film was continuous and homogeneous and no inclusion of the silicon grain was observed. In order to count the dislocation density in the single crystal silicon layer on the top surface, a single crystal silicon layer having the thickness of approximately 5 $\mu$m was epitaxially grown by the thermal CVD method on the single crystal silicon layer on the top surface and it was dipped in the wright etching solution for 90 seconds to visualize the crystal defects. The dislocation density was counted by an optical microscope and it was 600 /cm$^2$. In this example, the depthwise distribution of the accumulated oxygen atom concentration derived after the series of oxygen ion implantations were assumed as the Gaussian distribution although it may be any continuous distribution having a single peak.

Experimental Example 2

Figure 8:
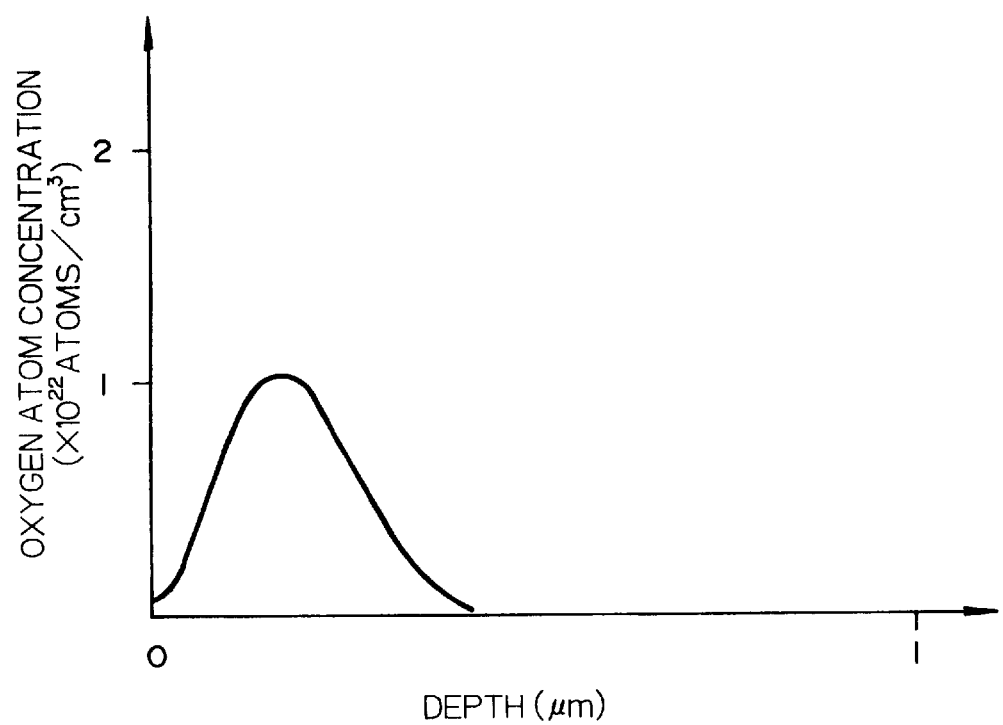
FIG. 8 shows another depthwise distribution of the oxygen atom concentration of the silicon substrate manufactured by the present invention.

Like in the Experimental Example 1, the oxygen ions of total dose of $2.24 \times 10^{17}$ ions/cm$^2$ were implanted into the silicon substrate while changing the energy stepwise to form the buried oxide film having the thickness of approximately 50 nm in the silicon substrate. The implantation energy of the oxygen ions was set to the four steps of 60, 80, 100 and 120 KeV and the oxygen dose at each implantation energy was set to $4.35 \times 10^{16}$, $5.26 \times 10^{16}$, $6.05 \times 10^{16}$ and $6.74 \times 10^{16}$ ions/cm$^2$ and the series of oxygen ion implantations were conducted. The depthwise distribution of the oxygen atom concentration in the silicon substrate after the oxygen implantation is shown in FIG. 8. The maximum oxygen atom concentration is $1.01 \times 10^{22}$ atoms/cm$^3$ at the depth of approximately 110 nm. The silicon substrate was placed in the electric furnace and thermally processed in the argon gas atmosphere including 0.5% of oxygen at the temperature of 1330° C. for six hours. As a result, the SOI structure comprising the single crystal silicon layer having the thickness of approximately 58 nm and the continuous and homogeneous buried oxide film having the thickness of approximately 50 nm was formed. The dislocation density of the single crystal silicon layer was approximately 500 /cm$^2$.

Experimental Example 3

Figure 9A:
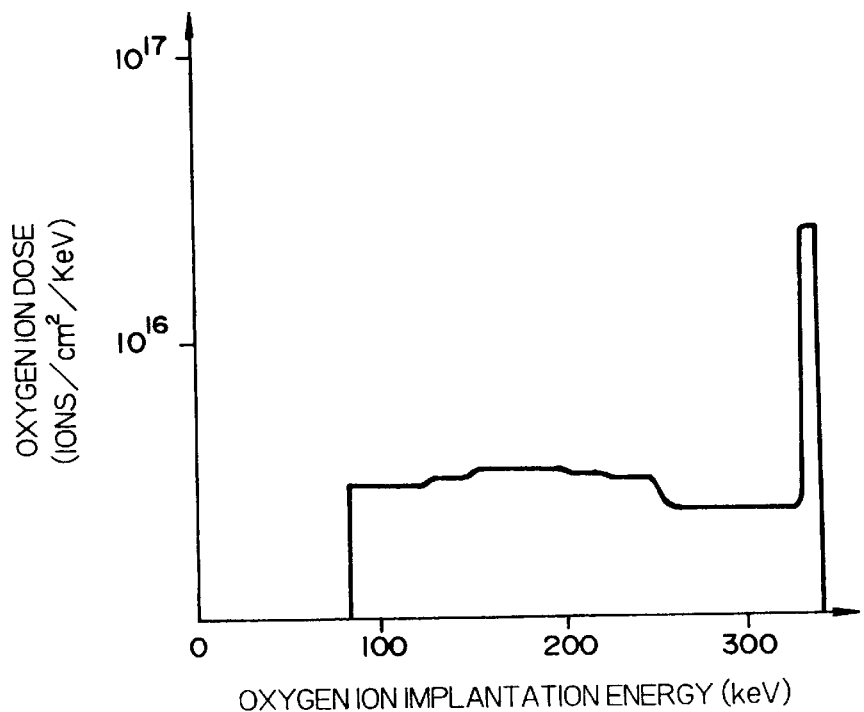
FIG. 9A shows a state of change of the implantation energy and an oxygen ion dose in the oxygen ion implantation.
Figure 9B:
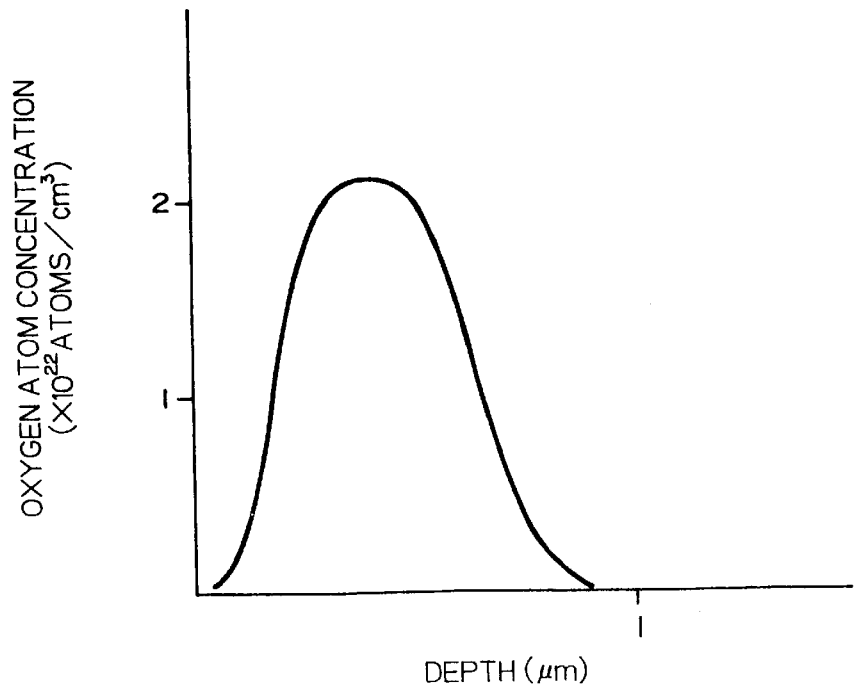
FIG. 9B shows a depthwise distribution of the oxygen atom concentration of the silicon substrate when the implantation energy is changed as shown in FIG. 9A, and FIGS. 10 and 11 show other examples of depthwise distribution of the oxygen atom concentration of the silicon substrate manufactured by the present invention.

The oxygen ions of the total dose of $1.0\times10^{18}$ ions/cm$^2$ were implanted into the silicon substrate while continuously changing the implantation energy from 345 KeV to 85 KeV to form the buried oxide film having the thickness of approximately 223 nm in the silicon substrate. The dose rate was kept constant by keeping the beam current of the oxygen ion constant, and the instant dose to the implantation energy was continuously changed as shown in FIG. 9A by changing the sweep rate of the implantation energy. The depthwise distribution of the oxygen atom concentration in the silicon substrate after the oxygen implantation was measured by the secondary ion mass spectroscopy and the result is shown in FIG. 9B. The means implantation depth of the oxygen ions was approximately 413 nm and the maximum oxygen atom concentration was approximately $2.14\times10^{22}$ atoms/cm$^3$. The silicon substrate was thermally processed in the argon gas atmosphere including 0.5% of oxygen at 1380° C. for four hours. As a result, the SOI structure comprising the single crystal silicon layer having the thickness of approximately 302 nm and the continuous and homogeneous buried oxide film having the thickness of approximately 223 nm was formed and the dislocation density of the single crystal silicon layer was approximately 700 /cm$^2$.

Experimental Example 4

Figure 10:
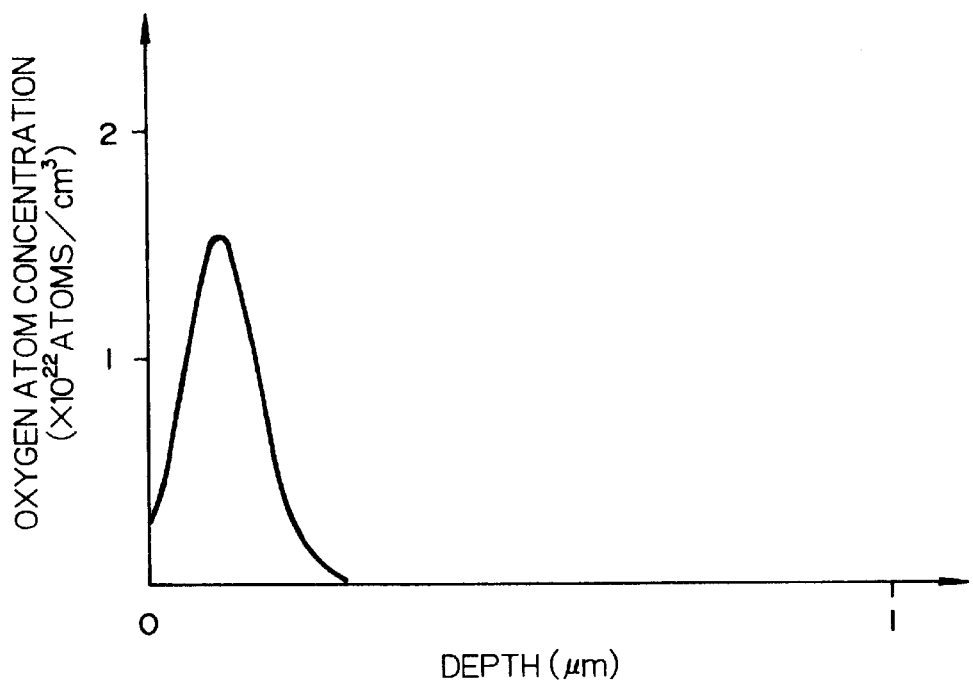

By etching the surface of the silicon substrate, the implantation depth of the oxygen ions was changed and the oxygen ions of the total dose of $2.0\times10^{17}$ ions/cm$^2$ were implanted at the energy of 60 KeV to form the buried oxide film having the thickness of approximately 44 nm in the silicon substrate. Each time the oxygen ions were implanted at $5\times10^{16}$ ions/cm$^2$, the silicon substrate was dipped in the aqueous solution of the mixture of ammonium and hydrogen peroxide to remove the surface of silicon substrate by 10 nm by the wet chemical etching, and then the remaining implantation was applied. The depthwise distribution of the oxygen atom concentration in the silicon substrate after the oxygen ion implantation is shown in FIG. 10. The maximum oxygen atom concentration was at the depth of approximately 100 nm and the maximum concentration was approximately $1.55\times10^{22}$ atoms/cm$^3$. By the removal of the silicon substrate surface by the etching and the sputtering of the silicon substrate surface by the ion beam during the implantation of the oxygen ions, approximately 2.5% of the dose was removed together with the silicon substrate surface. The silicon substrate was thermally processed in the argon atmosphere including 0.5% of oxygen at 1330° C. for six hours. As a result, the SOI structure comprising the single crystal silicon layer having the thickness of approximately 49 nm and the continuous and homogeneous buried oxide film having the thickness of approximately 44 nm was formed. The dislocation density of the single crystal layer was approximately 400 /cm$^2$.

Experimental Example 5

Figure 11:
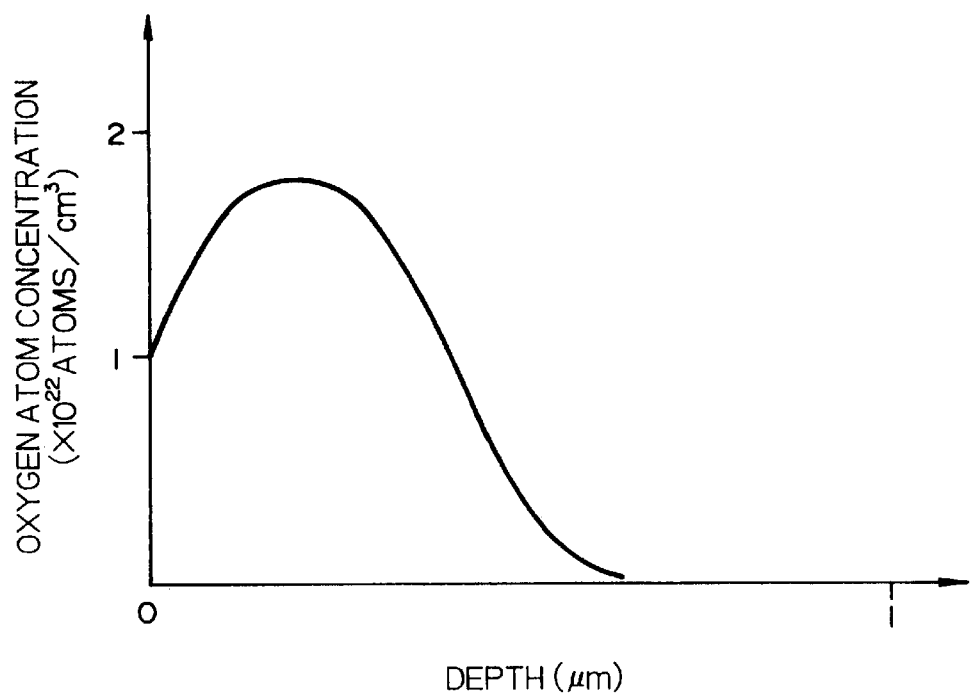

By depositing a polycrystalline silicon film on the surface of silicon substrate by the chemical vapor deposition, the implantation depth of the oxygen ions was changed, and the oxygen ions of the total dose of $8.0\times10^{17}$ ions/cm$^2$ were implanted to form the buried oxide film having the thickness of approximately 178 nm in the silicon substrate. Each time the oxygen ions were implanted at $1\times10^{17}$ ions/cm$^2$, the polycrystalline silicon film having the thickness of approximately 60 nm was deposited on the surface of the silicon substrate by the chemical vapor deposition, and then the remaining implantation was applied. The depthwise distribution of the oxygen atom concentration in the silicon substrate after the implantation of the oxygen ions is shown in FIG. 11. The maximum oxygen atom concentration was at the depth of approximately 220 nm and the maximum concentration was approximately $1.80\times10^{22}$ atoms/cm$^3$. The silicon substrate was thermally processed in the argon atmosphere including 0.5% of oxygen at 1330° C. for six hours. As a result, the SOI structure comprising the single crystal silicon layer having the thickness of approximately 135 nm and the continuous and homogeneous buried oxide film having the thickness of approximately 178 nm was formed. The dislocation density of the single crystal silicon layer was approximately 400 /cm$^2$.

INDUSTRIAL APPLICABILITY

In accordance with the present invention, the semiconductor substrate having the high quality of SOI structure comprising the homogeneous and uniform buried oxide film having the thickness of 40 nm to 200 nm or larger with the dislocation density in the single crystal silicon film on the buried oxide film being no larger than $10^3$ /cm$^2$ can be manufactured. Accordingly, by manufacturing silicon semiconductor devices such as complementary MIS transistors or bipolar transistors by using the semiconductor substrate, high performance devices with less leakage current and high insulation breakdown voltage are attained.

We claim:

1. A method for manufacturing an SOI type semiconductor comprising the step of:

performing a series of oxygen implantations without a thermal process therebetween, into a silicon substrate from a major surface thereof such that a maximum oxygen atom concentration is not larger than $2.25\times10^{22}$ atoms/cm$^3$ and not smaller than $1.0\times10^{22}$ atoms/cm$^3$.

2. A method for manufacturing an SOI type semiconductor substrate comprising the step of:

performing a series of oxygen implanations without a thermal process therebetween, into a silicon substrate from a major surface thereof such that a maximum oxygen atom concentration is not larger than $4\times10^{22}$ atoms/cm$^3$ and not smaller than $1.0\times10^{22}$ atoms/cm$^3$;

a total ion dose (in ions/cm$^2$) being equal to a value of a desired thickness of a buried oxide film multiplied by $4.48\times10^{22}$ in ions/cm$^3$.

3. A method for manufacturing an SOI type semiconductor substrate comprising the step of:

implanting oxygen ions to a silicon substrate from a major surface thereof such that a maximum oxygen atom concentration is no larger than $4\times10^{22}$ atoms/cm$^3$ and no smaller than $1.0\times10^{22}$ atoms/cm$^3$; wherein (i) a depthwise distribution of the oxygen atom concentration in the silicon substrate derived by the oxygen ion implantation has a single peak and decreases continuously before and after the peak;

(ii) a series of oxygen ion implantations are conducted continuously without a thermal process therebetween, while continuously or stepwise changing a mean implantation depth and an ion dose for the mean depth in the series of oxygen ion implantations; and (iii) the depthwise distribution of the oxygen atom concentration obtained by accumulating the depthwise distribution of the individual oxygen atom concentration corresponding to the mean implantation depth and the ion dose for the series of oxygen ion implantations is compared with a predetermined depthwise distribution of the oxygen atom concentration and the mean implantation depth and the ion dose in each of the series of oxygen ion implantations are determined such that both the distributions match.

4. A method for manufacturing an SOI type semiconductor substrate comprising the step of:

implanting oxygen ions to a silicon substrate from a major surface thereof such that a maximum oxygen atom concentration is not larger than $4 \times 10^{22}$ atoms/cm$^3$ and not smaller than $1.0 \times 10^{22}$ atoms/cm$^3$; wherein (i) a depthwise distribution of the oxygen atom concentration in the silicon substrate derived by the oxygen ion implantation has a single peak and decreases continuously before and after the peak;

(ii) a series of oxygen ion implantations are conducted continuously without a thermal process therebetween while continuously or stepwise changing a mean implantation depth and an ion dose for the mean depth in the series of oxygen ion implantations; and (iii) the depthwise distribution of the oxygen atom concentration obtained by accumulating the depthwise distribution of the individual oxygen atom concentration corresponding to the mean implantation depth and the ion dose for the series of oxygen ion implantations is compared with a selected oxygen atom concentration and a condition to be met by the distribution and the ion dose of each oxygen ion implantation is determined such that the depthwise distribution of the accumulated oxygen atom concentration meets said condition.

5. An apparatus for manufacturing a semiconductor substrate comprising:

a first processing unit for receiving ion implantation conditions in a series of ion implantation processes to output an implanted atom concentration distribution in the substrate for each implantation condition;

a second processing unit for receiving the output of said first processing unit to output an accumulated atom concentration distribution which is the sum of the implanted atom concentration distribution in the substrate for each ion implantation condition over the series of ion implantation processes;

a third processing unit for receiving the output of said second processing unit as a first input and one of conditions to be met by a desired atom concentration distribution as a second input to determine whether said first input matches to said second input or not and outputting a first output representing the decision and a second output representing a difference between said first input and said second input; and a fourth processing unit for receiving the first and second outputs of said third processing unit as first and second inputs. Respectively to output the series of ion implantation conditions inputted to said first processing unit as a first output when the first output of said third processing unit is affirmative, and output a second output indicating a correction amount to correct a selected one of the series of ion implantation conditions inputted to said first processing unit to decrease the second input when the first output of said third processing unit is negative.

6. An apparatus for manufacturing a semiconductor substrate according to claim 5 further comprising:

means for applying the first output of said fourth processing unit to a control unit of an ion implantation apparatus.

7. A method for manufacturing an SOI type semiconductor substrate comprising the steps of:

implanting oxygen ions into a silicon substrate from a major surface thereof; and thereafter applying a thermal process to form a buried oxide film in the silicon substrate; wherein said step of implanting oxygen ions includes a series of oxygen ion implantations having a mean implantation depth and an ion dose for the mean implantation depth continuously or stepwise changed; and the mean implantation depth and the ion dose for the mean implantation are determined such that a depthwise distribution of the oxygen atom concentration in the silicon substrate derived after the completion of the series of oxygen ion implantations has a single peak of no larger than $2.25 \times 10^{25}$ atoms/cm$^3$ and no smaller than $1.0 \times 10^{22}$ atoms/cm$^3$ and decreases continuously before and after the peak and the distribution of the oxygen atom concentration in a plane at a predetermined depth is uniform, and that the total ion dose (in ions/cm$^2$) takes a value of a desired thickness (in cm) of the buried oxide film multiplied by $4.48 \times 10^{22}$ in ions/cm$^3$.

* * * * *